(12) United States Patent
Sheen et al.

(10) Patent No.: US 11,431,320 B2
(45) Date of Patent: Aug. 30, 2022

(54) EVEN-MODE RESONATOR FILTER WITH HIGH STABILITY

(71) Applicant: ADVANCED CERAMIC X CORPORATION, Hsinchu County (TW)

(72) Inventors: Jyh-Wen Sheen, Hsinchu County (TW); Chih-Ming Chang, Hsinchu County (TW)

(73) Assignee: ADVANCED CERAMIC X CORPORATION, Hsinchu County (TW)

( * ) Notice: Subject to any disclaimer, the term of this patent is extended or adjusted under 35 U.S.C. 154(b) by 0 days.

(21) Appl. No.: 17/202,643

(22) Filed: Mar. 16, 2021

(65) Prior Publication Data
US 2022/0173719 A1   Jun. 2, 2022

(30) Foreign Application Priority Data

Dec. 2, 2020   (TW) .................................. 109142486

(51) Int. Cl.
*H03H 9/52* (2006.01)
*H03H 9/02* (2006.01)

(52) U.S. Cl.
CPC ........ *H03H 9/525* (2013.01); *H03H 9/02433* (2013.01)

(58) Field of Classification Search
CPC ........................... H03H 9/525; H03H 9/02433
USPC ........................................................ 333/186
See application file for complete search history.

(56) References Cited

U.S. PATENT DOCUMENTS 5,764,115 A * 6/1998 Hattori .................. H01P 1/2086
333/219.1

* cited by examiner

*Primary Examiner* — Rakesh B Patel
*Assistant Examiner* — Jorge L Salazar, Jr.

(57) ABSTRACT

An even-mode resonator filter is disclosed. The even-mode resonator filter is provided with high stability, and comprises: a first even-mode resonance module, a second even-mode resonance module, a first filter unit and a second filter unit. In the present invention, the first even-mode resonance module comprises a first resonance unit and a second resonance unit, and the second even-mode resonance module comprises a third resonance unit and a fourth resonance unit. By letting the second resonance unit be coupled to the first resonance unit as well as making the third resonance unit be coupled to the fourth resonance unit, the even-mode resonator filter of the present invention has the advantage of eliminating unexpected resonance.

7 Claims, 9 Drawing Sheets

EVEN-MODE RESONATOR FILTER WITH HIGH STABILITY

BACKGROUND OF THE INVENTION

1. Field of the Invention

The present invention relates to the technology field of micro-electro-mechanical (MEMS) systems technology, and more particularly to an even-mode resonator filter with high stability.

2. Description of the Prior Art

With the advancement of the communications industry and technology, the market's demand for filters has been developed towards miniaturization and high inhibition rate of noise signal. However, with the miniaturization of filters, the size and cutting errors will increase during the production process.

As the electronic engineers skilled in filter and communication components well know, when the inside structure of the coupled filter is asymmetrical due to the size or cutting errors, the coupled filter will become the odd mode, thereby decreasing the inhibition rate of noise signal. Wherein the reasons for the inside structure asymmetry of the filter including asymmetry of input end and output end, position shifted of sheet metals, asymmetry of sheet metal size, and cutting error. It is extrapolated that, how to redesign and improve the foregoing situation and provide a filter with high quality factor has become an important issue of related companies and market.

In view of that, inventors of the present application have made great efforts to make inventive research and eventually provided an even-mode resonator filter with high stability.

SUMMARY OF THE INVENTION

The primary objective of the present invention is to provide an even-mode resonator filter with high stability. The even-mode resonator filter comprises: a first even-mode resonance module, a second even-mode resonance module, a first filter unit, and a second filter unit. Wherein a first resonance unit and a second resonance unit of the first even-mode resonance module are both coupled between an input end and an output end. The first resonance unit is electrically connected with the second resonance unit in parallel. Moreover, a third resonance unit of the second even-mode resonance module is electrically connected between the first resonance unit and the input end. A fourth resonance unit of the second even-mode resonance module is electrically connected between the second resonance unit and the output end, and is electrically connected to the third resonance unit in parallel. According to the electrical connection design between the fourth resonance unit and the third resonance unit, and the second resonance unit and the first resonance unit, the even-mode resonator filter of the present invention includes the advantages of high quality factor and high inhibition rate of noise signal.

In order to achieve the primary objective of the present invention, the inventor of the present invention provides an embodiment for the even-mode resonator filter, comprise:
a first even-mode resonance module, comprising:
   a first resonance unit, having a first end and a second end, and the first end and the second end being coupled to an input end and an output end, respectively;
   a second resonance unit, being coupled between the input end and the output end, and being electrically connected with the first resonance unit in parallel;
a second even-mode resonance module, being coupled to the first even-mode resonance module, and comprising:
   a third resonance unit, being electrically connected between the first resonance unit and the output end;
   a fourth resonance unit, being electrically connected between the second resonance unit and the output end, and electrically connected with the third resonance unit;
a first filter unit, being electrically connected between the first resonance unit and the third resonance unit,
a second filter unit, being electrically connected between the second resonance unit and the fourth resonance unit,
wherein the first even-mode resonance module, the second even-mode resonance module, the first filter unit and the second filter unit be integrated in a main body, and the input end and the output end being extended out of the main body.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an even-mode resonator filter with high stability disclosed by the present invention, embodiments of the present invention will be described in detail with reference to the attached drawings hereinafter.

First Embodiment

Figure 1:
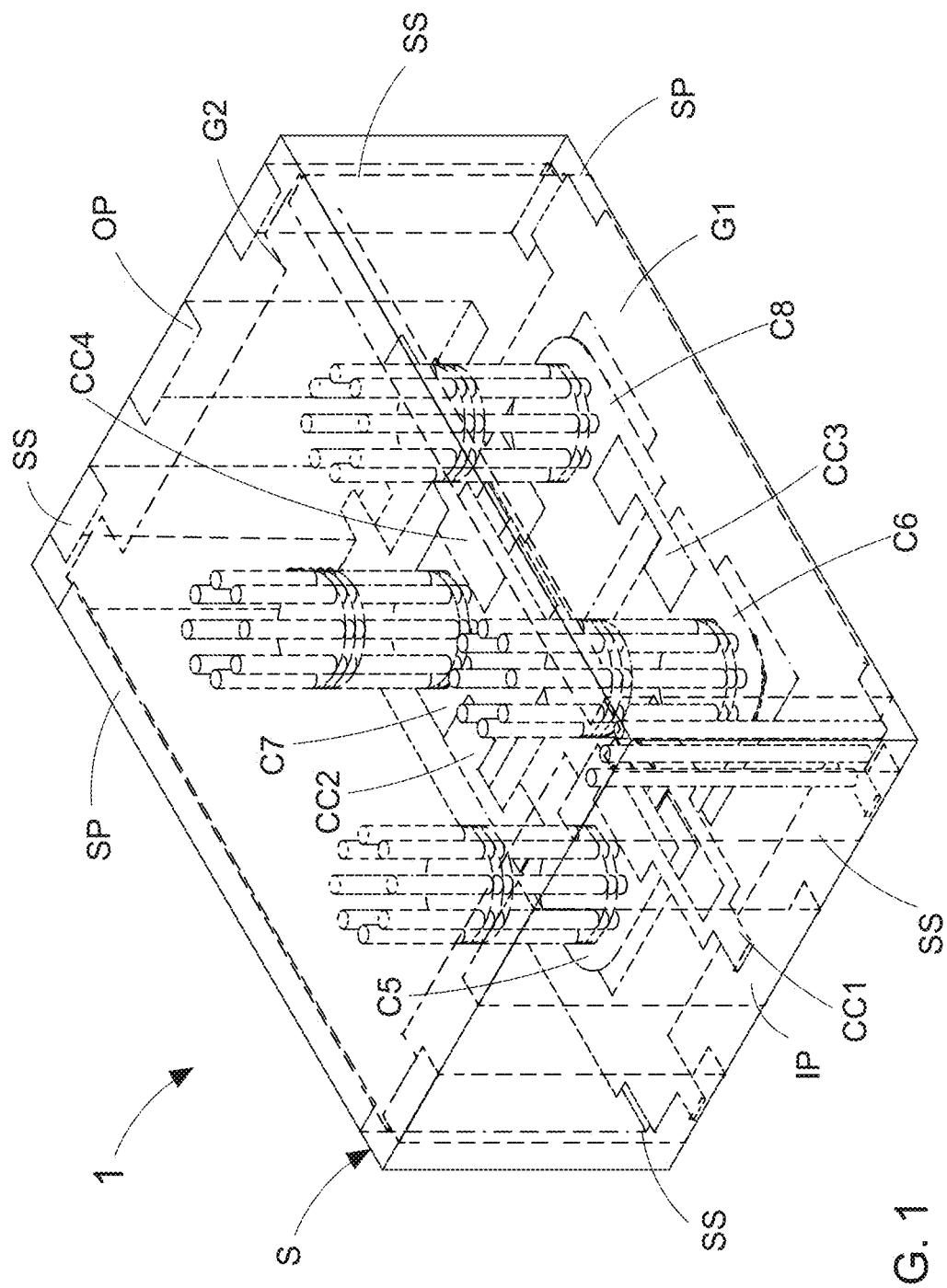
FIG. 1 shows a perspective view of a first embodiment of an even-mode resonator filter with high stability according to the present invention.
Figure 2:
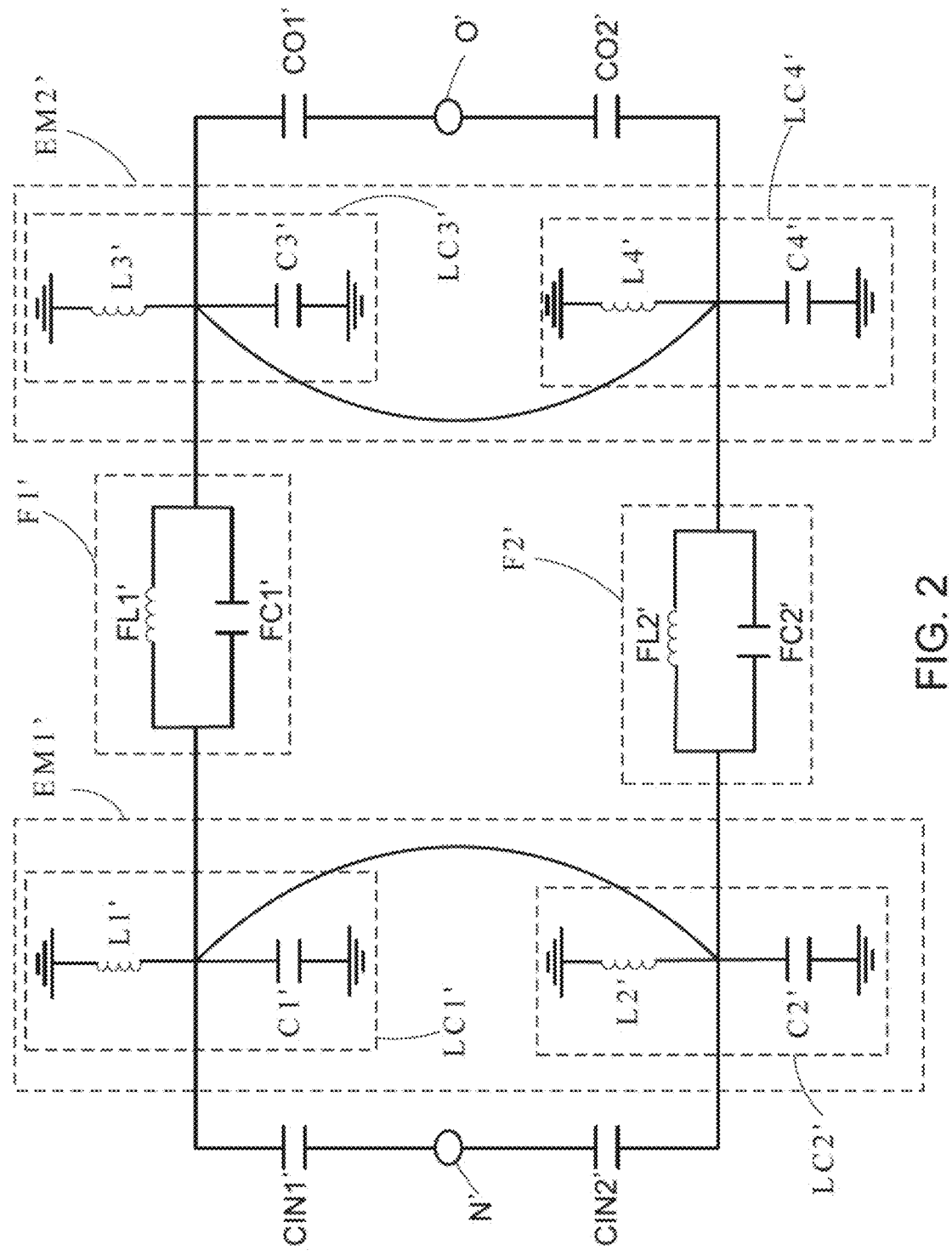
FIG. 2 shows an equivalent circuit diagram of the first embodiment of the even-mode resonator filter.
Figure 3:
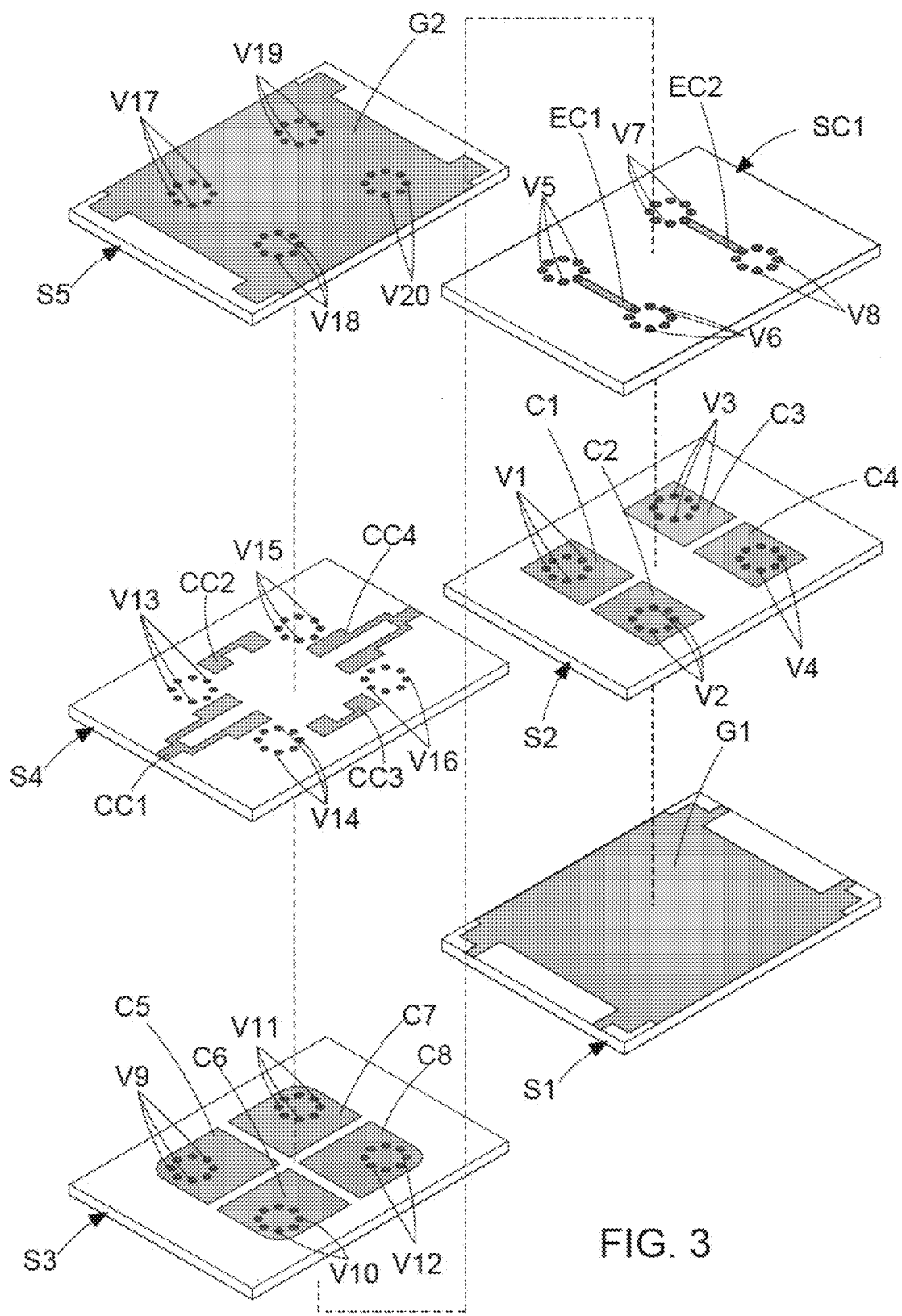
FIG. 3 shows an exploded view of the first embodiment of the even-mode resonator filter.

FIG. 1 shows a perspective view of a first embodiment of an even-mode resonator filter with high stability according to the present invention, and FIG. 2 shows an equivalent circuit diagram of the first embodiment of the even-mode resonator filter. From FIG. 1 and FIG. 2, it is understood that the even-mode resonator filter 1 of the present invention comprises a first even-mode resonance module EM1', a second even-mode resonance module EM2', a first resonance unit F1', and a second resonance unit F2'. As shown in FIG. 2, the first even-mode resonance module EM1' comprises a first resonance unit LC1' and a second resonance unit LC2', and the second even-mode resonance module EM2' comprises a third resonance unit LC3' and a fourth resonance unit LC4'. Particularly, the first resonance unit LC1' has a first end and a second end, and the first end and the second end are coupled to an input end N' and the output end O', respectively. The second resonance unit LC2' is coupled between the input end N' and the output end O', and electrically connected with the first resonance unit LC1' in parallel. Moreover, the third resonance unit LC3' is electrically connected between the first resonance unit LC1' and the output end O'. The fourth resonance unit LC4' is electrically connected between the second resonance unit LC2' and the output end O', and is electrically connected with the third resonance unit LC3' in parallel. FIG. 3 shows an exploded view of the first embodiment of the even-mode resonator filter. It is worth noting that, the electrical connection between the first resonance unit LC1' and the second resonance unit LC2' by a first connection plate EC1, and the electrical connection between the third resonance unit LC1' and the fourth resonance unit LC2' by a second connection plate EC2, thereby letting the even-mode resonator filter has advantages of suppressing the generation of odd mode and eliminating unexpected resonance caused by odd mode.

More particularly, the first filter unit F1' is electrically connected between the first resonance unit LC1' and the third resonance unit LC3'. The second filter unit F2' is electrically connected between the second resonance unit LC2' and the fourth resonance unit LC4'. Wherein the first even-mode resonance module EM1', the second even-mode resonance module EM2', the first filter unit F1', and the second filter unit F2' be integrated in a main body S, and the input end N' and the output end O' are both extended out of the main body S. From FIG. 2, it is understood that the even-mode resonator filter 1 further comprises: a first input capacitor CIN1', a second input capacitor CIN2', a first output capacitor CO1', and a second output capacitor CO2'. The first input capacitor CIN1' has a first end and a second end, and the first end and the second end are coupled to the first resonance unit LC1' and the input end N', respectively. Moreover, the second input capacitor CIN2' has a first end and a second end, and the first end and the second end are coupled to the second resonance unit LC2' and the input end N', respectively. The first output capacitor CO1' has a first end and a second end, and the first end and the second end are coupled to the third resonance unit LC3' and the output end O', respectively. The second output capacitor CO2' has a first end and a second end, and the first end and the second end are coupled to the fourth resonance unit LC4' and the output end O', respectively. The first input capacitor CIN1', the second input capacitor CIN2', the first output capacitor CO1' and the second output capacitor CO2' are also integrated in the main body S.

From FIG. 1, FIG. 2, and FIG. 3, it is understood that the main body S is consisted of a plurality of dielectric plates, and the plurality of dielectric plates comprise: a first plate S1, a second plate S2, a connection plate SC1, a third plate S3, a fourth plate S4, and a fifth plate S5. Wherein the first plate S1 has a first ground layer G1 thereon. The second plate S2 is stacked on the first plate S1, and has a first conductive layer C1, a second conductive layer C2, a third conductive layer C3, and a fourth conductive layer C4 thereon. Particularly, a plurality of first conductive columns V1 are disposed on the first conductive layer C1, a plurality of second conductive columns V2 are disposed on the second conductive layer C2, a plurality of third conductive columns V3 are disposed on the third conductive layer C3, and a plurality of fourth conductive columns V4 are disposed on the fourth conductive layer C4. Moreover, the first connection plate SC1 is stacked on the second plate S2, and has a first connecting layer EC1 and a second connecting layer EC2 thereon. There is at least one fifth conductive column V5 and at least one sixth conductive column V6 are disposed on the first connecting layer EC1, and at least one seventh conductive column V7 and at least one eighth conductive column V8 are disposed on the second connecting layer EC2. Moreover, the third plate S3 is stacked on the first connection plate SC1, and has a fifth conductive layer C5, a sixth conductive layer C6, a seventh conductive layer C7, and an eighth conductive layer C8 thereon. Particularly, a plurality of ninth conductive columns V9 are disposed on the fifth conductive layer C5, a plurality of tenth conductive columns V10 are disposed on the sixth conductive layer C6, a plurality of eleventh conductive columns V11 are disposed on the seventh conductive layer C7, and a plurality of twelfth conductive columns V12 are disposed on the eighth conductive layer C8. The fourth plate S4 is stacked on the third plate S3, and is provided with an input capacitor layer CC1, a first capacitor layer CC2, a second capacitor layer CC3, and an output capacitor layer CC4 thereon, wherein a plurality of thirteenth conductive columns V13, a plurality of fourteenth conductive columns V14, a plurality of fifteenth conductive columns V15, and a plurality of sixteenth conductive columns V16 are disposed on the fourth plate S4. Furthermore, the fifth plate S5 is stacked on the fourth plate S4, and has a second ground layer G2 thereon, wherein a plurality of seventeenth conductive columns V17, a plurality of eighteenth conductive columns V18, a plurality of nineteenth conductive columns V19, and a plurality of twentieth conductive columns V20 are disposed on the fifth plate S5.

By such arrangement, the plurality of first conductive columns V1, the plurality of fifth conductive columns V5, the plurality of ninth conductive columns V9, the plurality of thirteenth conductive columns V13, and the plurality of seventeenth conductive columns V17 are connected to each other for equivalently forming a first resonance inductor L1' of the first resonance unit LC1'. Moreover, the plurality of second conductive columns V2, the plurality of sixth conductive columns V6, the plurality of tenth conductive columns V10, the plurality of fourteenth conductive columns V14, and the plurality of eighteenth conductive columns V18 are connected to each other for equivalently forming a second resonance inductor L2' of the second resonance unit LC2'. The plurality of third conductive columns V3, the plurality of seventh conductive columns V7, the plurality of eleventh conductive columns V11, the plurality of fifteenth conductive columns V15, and the plurality of nineteenth conductive columns V19 are connected to each other for equivalently forming a third resonance inductor L3' of the third resonance unit LC3'. The plurality of fourth conductive columns V4, the plurality of eighth conductive columns V8, the plurality of twelfth conductive columns V12, the plurality of sixteenth conductive columns V16, and the plurality of twentieth conductive columns V20 are connected to each other for equivalently forming a fourth resonance inductor L4' of the fourth resonance unit LC4'. It is worth noting that, the first ground layer G1 and the first conductive layer C1 are equivalently formed a first capacitor C1' of the first resonance unit LC1', and the first capacitor C1' is connected in parallel with the first resonance inductor L1'. The first ground layer G1 and the second conductive layer C2 are equivalently formed a second capacitor C2' of the second resonance unit LC2', and the second capacitor C2' is connected in parallel with the second resonance inductor L2'. Moreover, the first ground layer G1 and the third conductive layer C3 are equivalently formed a third capacitor C3' of the third resonance unit LC3', and the third capacitor C3' is connected in parallel with third resonance inductor L3'.

The first ground layer G1 and the fourth conductive layer C4 are equivalently formed a fourth capacitor C4' of the fourth resonance unit LC4', and the fourth capacitor C4' is connected in parallel with the fourth resonance inductor L4'. As shown in FIG. 1, FIG. 2, and FIG. 3, the input capacitor layer CC1 and the fifth conductive layer C5 are equivalently formed the first input capacitor CIN1', and the input capacitor layer CC1 and the sixth conductive layer C6 are equivalently formed the second input capacitor CIN2'. The output capacitor layer CC4 and the seventh conductive layer C7 are equivalently formed the first output capacitor CO1'. Moreover, the output capacitor layer CC4 and the eighth conductive layer C8 are equivalently formed the second output capacitor CO2'. The first capacitor layer CC2, the fifth conductive layer C5, and the seventh conductive layer C7 are equivalently formed a capacitor FC1' of the first resonance unit F1'. The first capacitor layer CC2 is equivalently formed an inductor FL1' of the first resonance unit F1', and the inductor FL1' of the first resonance unit F is in parallel with the capacitor FC1' of the first resonance unit F1'. The second capacitor layer CC3, the sixth conductive layer C6, and the eighth conductive layer C8 are equivalently formed a capacitor FC2' of the second resonance unit F2'. The second capacitor layer CC3 is equivalently formed an inductor FL2' of the second resonance unit F2', and the inductor FL2' is in parallel with the capacitor FC2' of the first resonance unit F2'. According to the first resonance unit F1' and the second resonance unit F2', thereby letting a first signal transmitted in the first even-mode resonance module EM1' can be coupled to the second even-mode resonance module EM2' with higher stability and higher inhibition rate of noise signal.

More particularly, there are an input plate IP and an output plate OP attached onto two opposite sides of the main body S the even-mode resonator filter 1, and the even-mode resonator filter 1 further comprises a plurality of peripheral plates SS and two connection side plates SP. Wherein the plurality of peripheral plates SS are attached on the forgoing two opposite sides of the main body S. The two connection side plates SP are connected between the first ground layer G1 of the first plate Si and the second ground layer G2 of the fifth plate S5, such that the first ground layer G1 and the second ground layer G2 are equivalently formed the ground unit, and the first even-mode resonance module EM1' and the second even-mode resonance module EM2' are coupled to the ground unit. As shown in FIG. 2 and FIG. 3, the plurality of conductive columns are arranged in a circle. It is worth noting that, the plurality of conductive columns of the present invention are able to also be arranged in a rectangular, elliptical, sector shaped.

Second Embodiment

Figure 4:
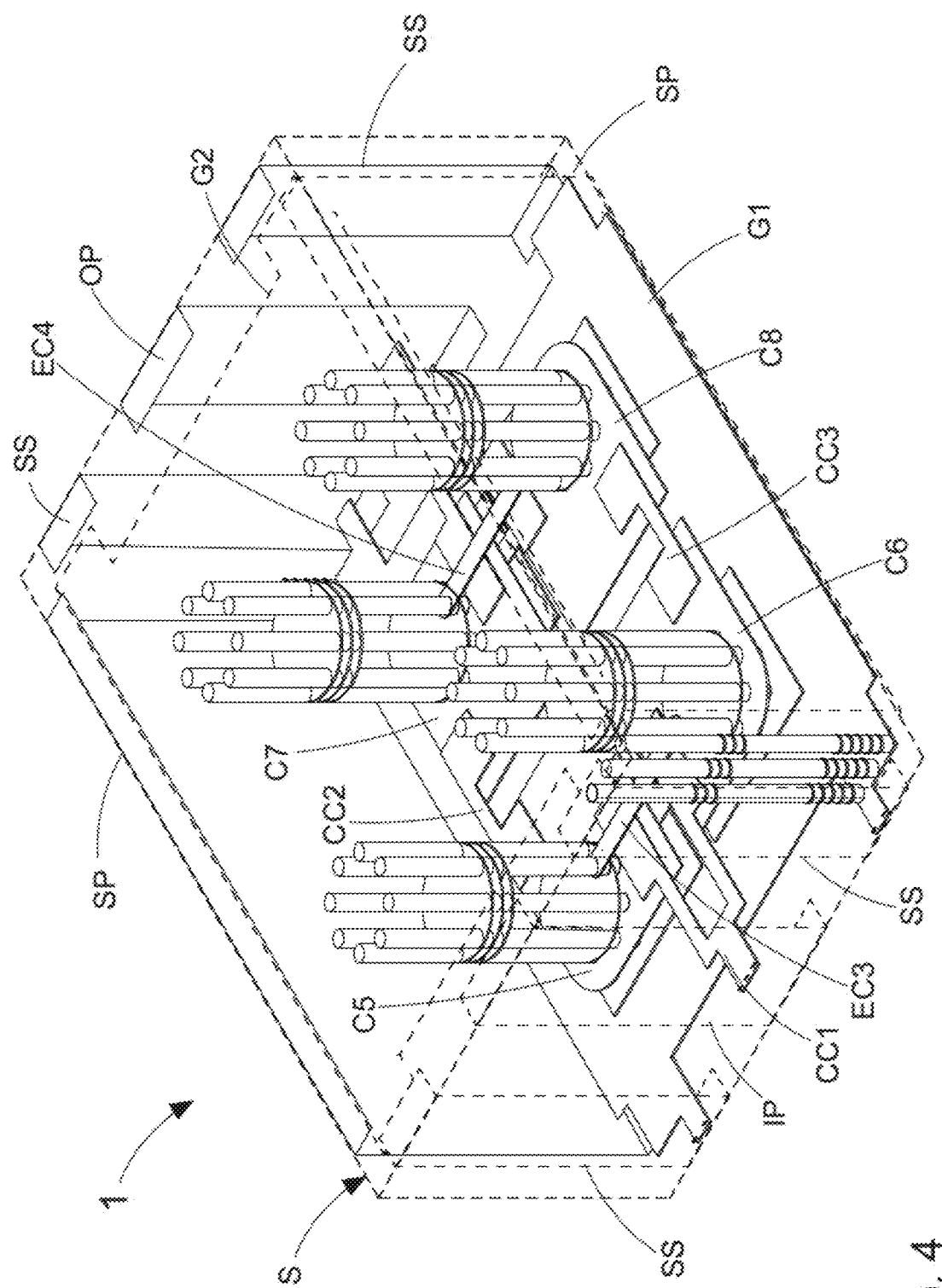
FIG. 4 shows a perspective view of a second embodiment of the even-mode resonator filter.
Figure 5:
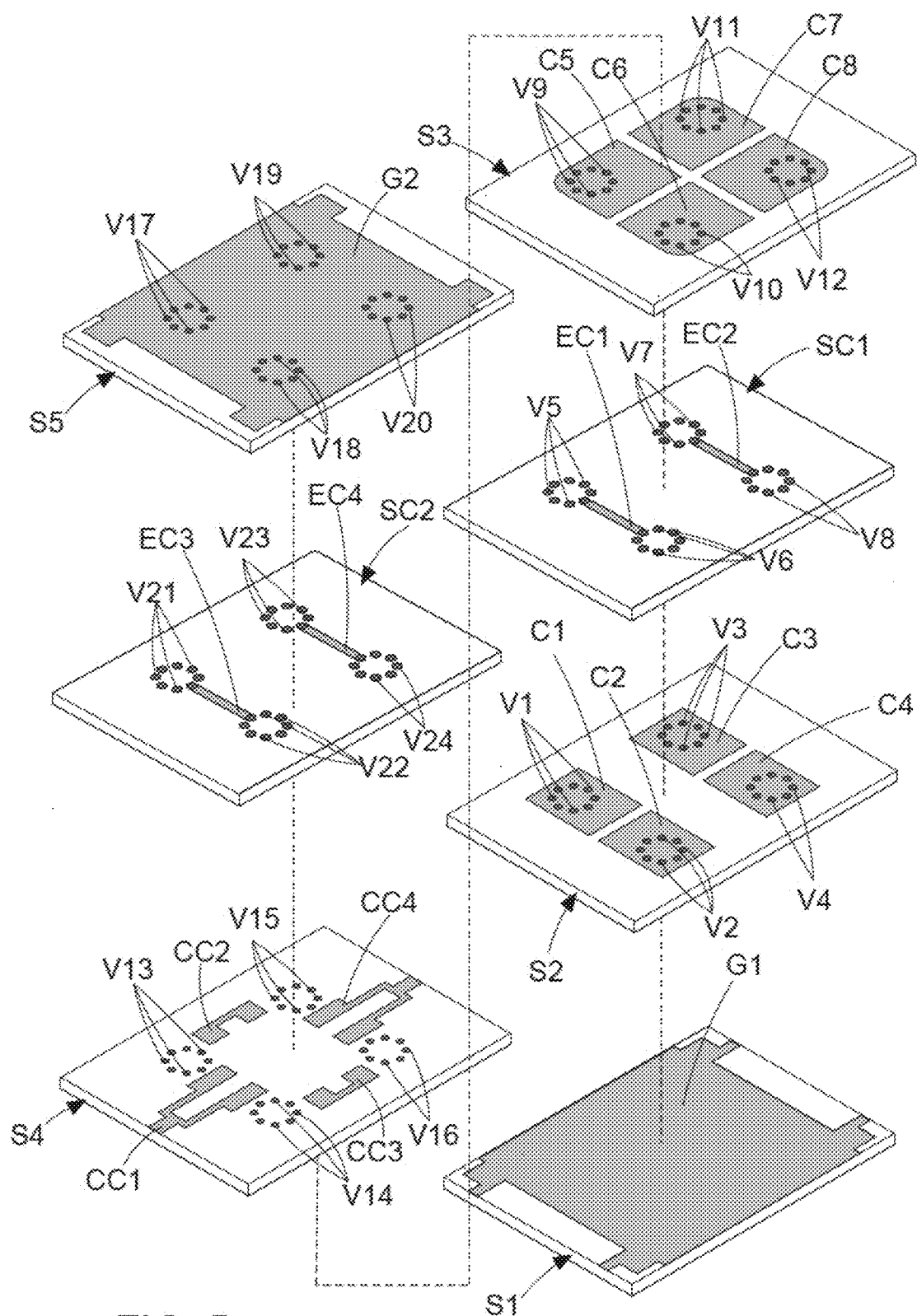
FIG. 5 shows an exploded view of the second embodiment of the even-mode resonator filter.

FIG. 4 shows a perspective view of a second embodiment of the even-mode resonator filter, and FIG. 5 shows an exploded view of the second embodiment of the even-mode resonator filter. After comparing FIG. 5 with FIG. 3, it is able to find that the second embodiment of the even-mode resonator filter 1 further comprises a second connection plate SC2. The second connection plate SC2 is stacked on the fourth plate S4, and has a third connecting layer EC3 and a fourth connecting layer EC4 thereon. At least one of a plurality of twenty-first conductive columns V21 and at least one of a plurality of twenty-second conductive columns V22 are disposed on the third connecting layer EC3, and at least one of a plurality of twenty-third conductive columns V23 and at least one of a plurality of twenty-fourth conductive columns V24 are disposed on the fourth connecting layer EC4. It is worth noting that, the amount of the conductive columns which be disposed on the connecting layer can be adjusted by user.

In the second embodiment of the present invention, the plurality of first conductive columns V1, the plurality of fifth conductive columns V5, the plurality of ninth conductive columns V9, the plurality of thirteenth conductive columns V13, the plurality of seventeenth conductive columns V17, and the plurality of twenty-first conductive columns V21 are connected to each other for equivalently forming the first resonance inductor L1' of the first resonance unit LC1'. The plurality of second conductive columns V2, the plurality of sixth conductive columns V6, the plurality of tenth conductive columns V10, the plurality of fourteenth conductive columns V14, the plurality of eighteenth conductive columns V18, and the twenty-second conductive columns V22 are connected to each other for equivalently forming the second resonance inductor L2' of the second resonance unit LC2'. The plurality of third conductive columns V3, the plurality of seventh conductive columns V7, the plurality of eleventh conductive columns V11, the plurality of fifteenth conductive columns V15, the plurality of nineteenth conductive columns V19, and the twenty-third conductive columns V23 are connected to each other for equivalently forming the third resonance inductor L3' of the third resonance unit LC3'. Moreover, the plurality of fourth conductive columns V4, the plurality of eighth conductive columns V8, the plurality of twelfth conductive columns V12, the plurality of sixteenth conductive columns V16, the plurality of twentieth conductive columns V20, and the twenty-fourth conductive columns V24 are connected to each other for equivalently forming the fourth resonance inductor L4' of the fourth resonance unit LC4'.

As the electronic engineers skilled in filter and communication components well know, when the inside structure of the coupled filter is asymmetrical due to the size or cutting errors during manufacturing, the coupled filter will become the odd mode, thereby decreasing the inhibition rate of noise signal. The second embodiment of the present invention makes the first resonance unit LC1' electrically connecting to the second resonance unit LC2' by the first connection plate EC1 and the third connection plate EC3. Also, the third resonance unit LC3' is electrically connected to the fourth resonance unit LC4' by the second connection plate EC2 and the fourth connection plate EC4. By such arrangement, the even-mode resonator filter 1 has advantages of suppressing the generation of odd mode and eliminating unexpected resonance caused by odd mode.

Third Embodiment

Figure 6:
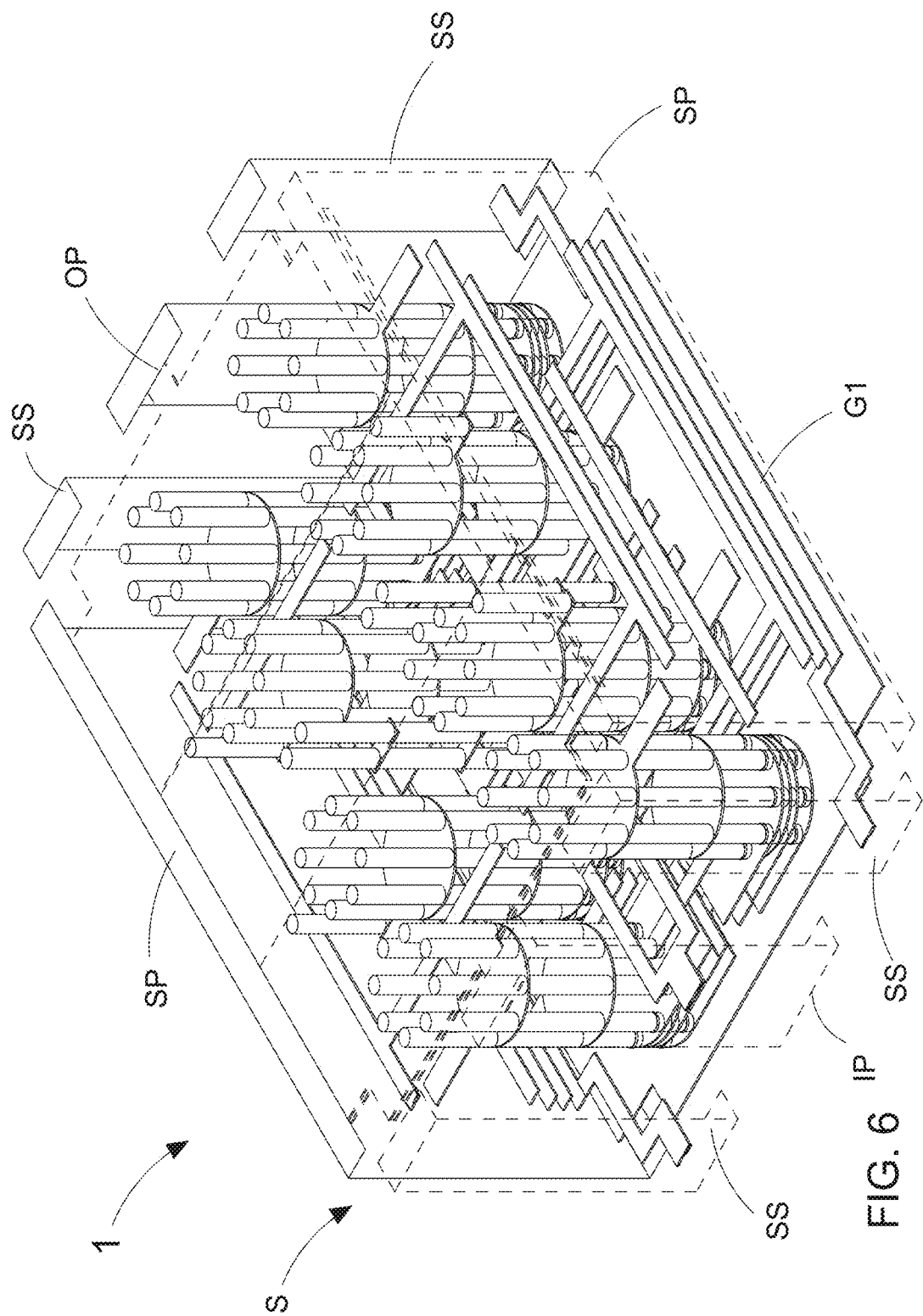
FIG. 6 shows a perspective view of a third embodiment of the even-mode resonator filter.
Figure 7:
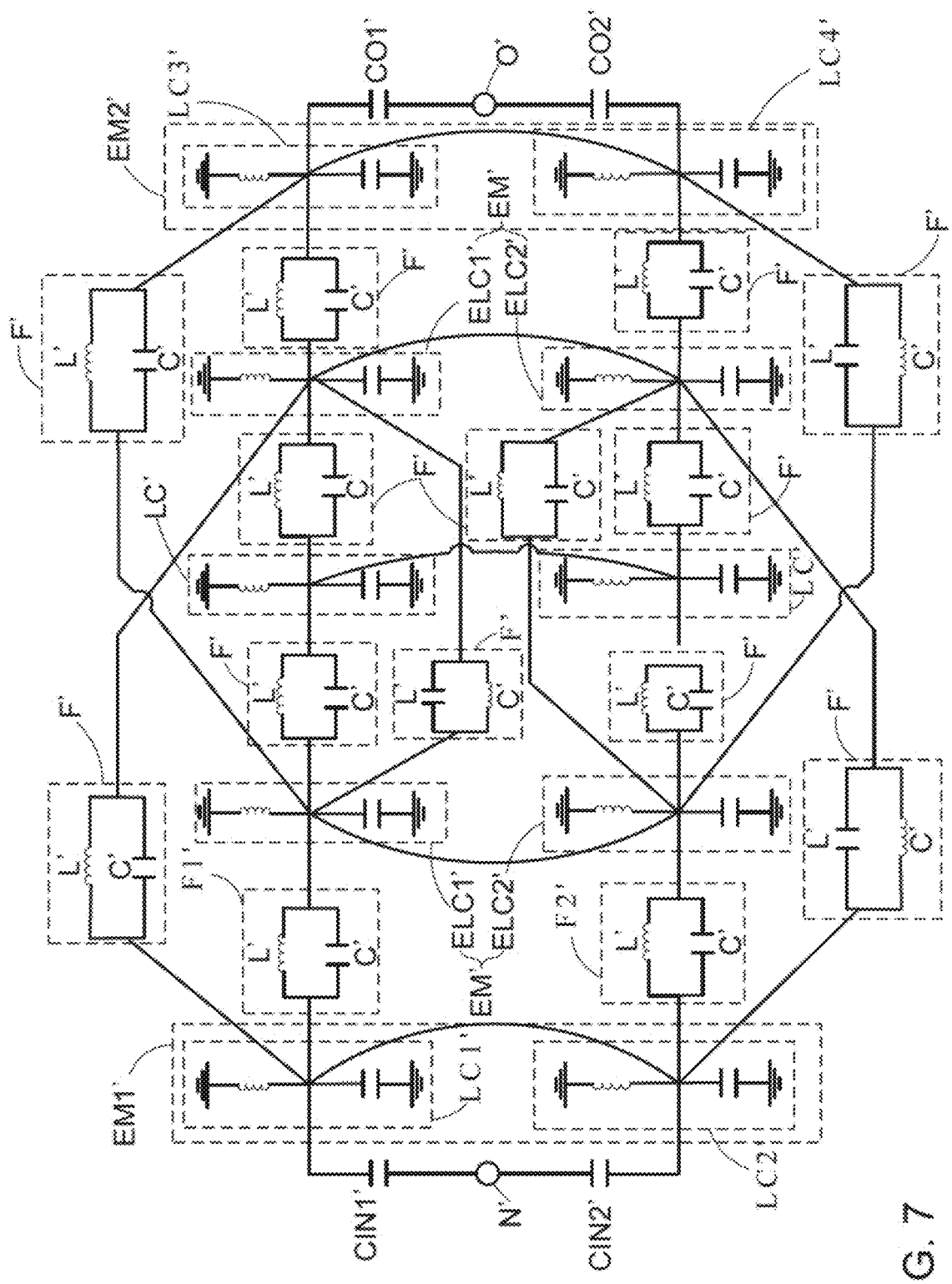
FIG. 7 shows an equivalent circuit diagram of the third embodiment of the even-mode resonator filter.
Figure 8:
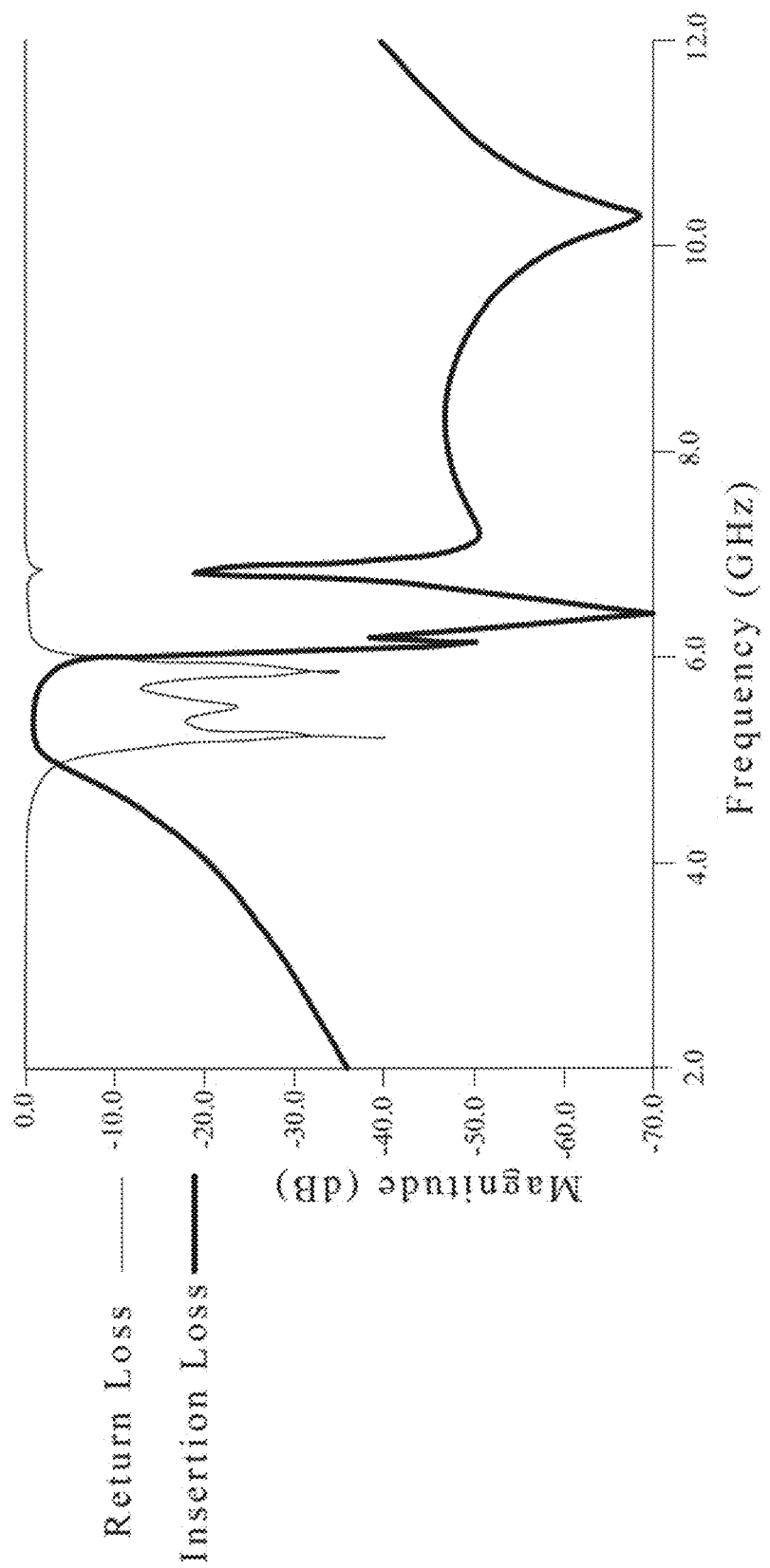
FIG. 8 shows a frequency response graph of a conventional even-mode resonator filter.
Figure 9:
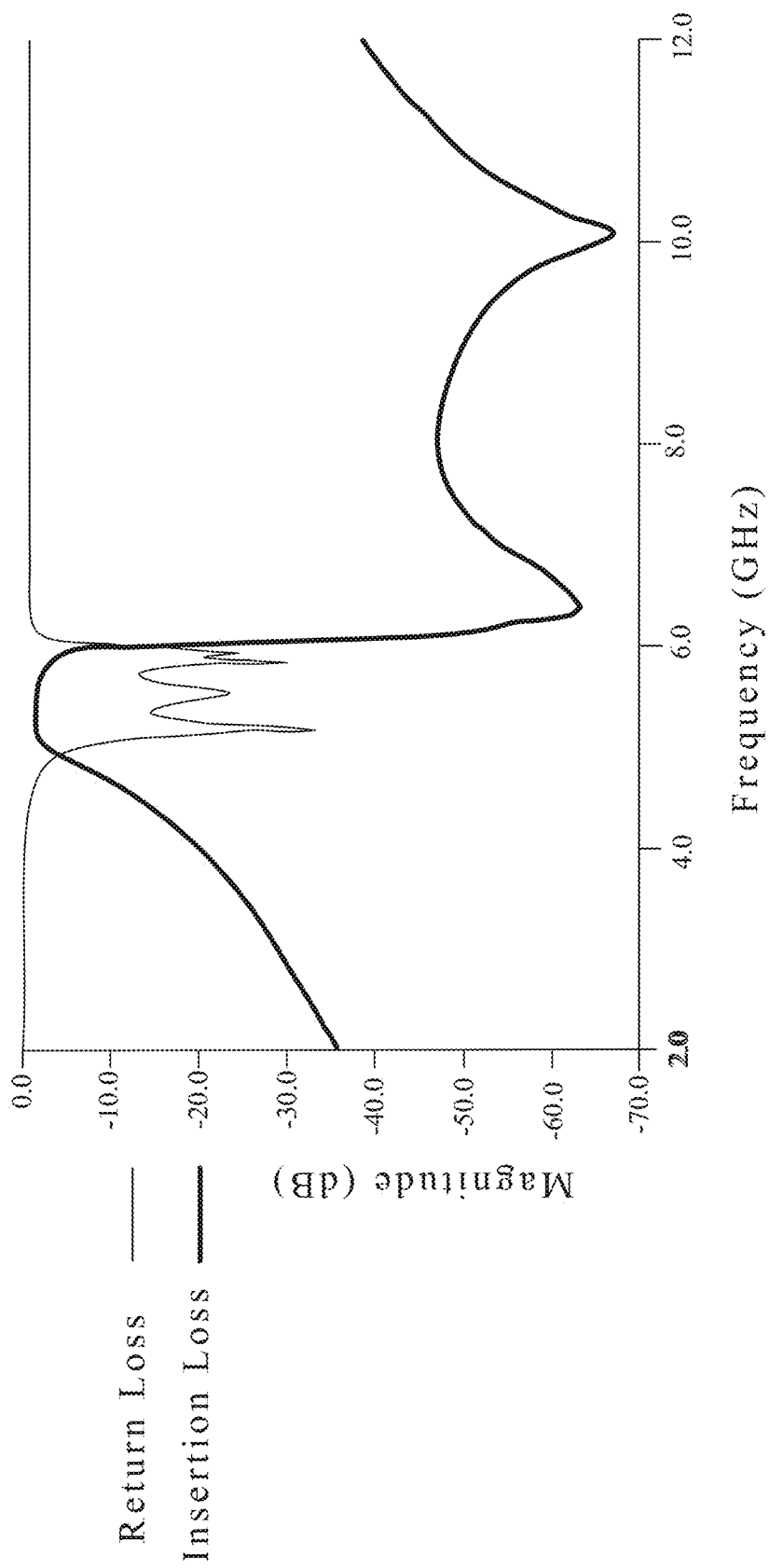
FIG. 9 shows a frequency response graph of the coupled resonator filter of the present invention.

FIG. 6 shows a perspective view of a third embodiment of the even-mode resonator filter. After comparing FIG. 6 with FIG. 2, it is able to find that the third embodiment of the even-mode resonator filter 1 further comprises at least two extra resonance modules EM' and a plurality of filter units F'. The at least two extra resonance modules EM' are coupled between the first even-mode resonance module EM1' and the second even-mode resonance module EM2'. The at least two extra resonance module EM' respectively comprises a first extra resonance unit ELC1' and a second extra resonance unit ELC2' that is electrically connected to the first extra resonance unit ELC1'. FIG. 8 shows a frequency response graph of a conventional even-mode resonator filter. The plurality of filter units F' are coupled between each two of the first extra resonance unit ELC1', and are coupled between each two of the second extra resonance unit ELC2', respectively. Each of the plurality of the filter units F' has an inductor L' and a capacitor C' that is in parallel with the inductor L'. Particularly, FIG. 8 shows a plot of the insertion loss and return loss of the even-mode resonator filter without the first connecting layer EC1, the second connecting layer EC2, the third connecting layer EC3, and fourth connecting layer EC4 at the operating frequency range. FIG. 9 shows a frequency response graph of the coupled resonator filter of the present invention. After comparing FIG. 9 with FIG. 8, it is able to know that, the inhibition rate of noise signal shown in FIG. 9 is better than the inhibition rate of noise signal shown in FIG. 8 with a frequency range from 6.0 GHz to 8.0 GHz. In other words, the first connecting layer EC1, the second connecting layer EC2, the third connecting layer EC3, and fourth connecting layer EC4 of the present invention effectively suppressing the generation of odd mode and eliminating unexpected resonance caused by odd mode, thereby letting the coupled resonator filter with high stability and high quality factor.

The above description is made on embodiments of the present invention. However, the embodiments are not intended to limit scope of the present invention, and all equivalent implementations or alterations within the spirit of the present invention still fall within the scope of the present invention.

What is claimed is:

1. An even-mode resonator filter, comprising:
   a first even-mode resonance module, comprising:
   a first resonance unit, having a first end and a second end, and the first end and the second end being coupled to an input end and an output end, respectively; and
   a second resonance unit, being coupled between the input end and the output end, and being electrically connected with the first resonance unit in parallel;
   a second even-mode resonance module, being coupled to the first even-mode resonance module, and comprising:
   a third resonance unit, being electrically connected between the first resonance unit and the output end; and
   a fourth resonance unit, being electrically connected between the second resonance unit and the output end, and electrically connected with the third resonance unit;
   a first filter unit, being electrically connected between the first resonance unit and the third resonance unit; and
   a second filter unit, being electrically connected between the second resonance unit and the fourth resonance unit;
   wherein the first even-mode resonance module, the second even-mode resonance module, the first filter unit, and the second filter unit be integrated in a main body, and the input end and the output end being extended out of the main body.

2. The even-mode resonator filter of claim 1, further comprising:
   a first input capacitor, having a first end and a second end, and the first end and the second end are coupled to the first resonance unit and the input end, respectively;
   a second input capacitor, having a first end and a second end, and the first end and the second end are coupled to the second resonance unit and the input end, respectively;
   a first output capacitor, having a first end and a second end, and the first end and the second end are coupled to the third resonance unit and the output end, respectively; and
   a second output capacitor, having a first end and a second end, and the first end and the second end are coupled to the fourth resonance unit and the output end, respectively;
   wherein the first input capacitor, the second input capacitor, the first output capacitor and the second output capacitor are also integrated in the main body.

3. The even-mode resonator filter of claim 2, wherein an input plate and an output plate are attached on two opposite sides of the main body that is consisted of a plurality of dielectric plates, and the plurality of dielectric plates comprising:
   a first plate having a first ground layer thereon;
   a second plate, being stacked on the first plate, and having a first conductive layer, a second conductive layer, a third conductive layer and a fourth conductive layer thereon, wherein a plurality of first conductive columns are disposed on the first conductive layer, a plurality of second conductive columns being disposed on the second conductive layer, a plurality of third conductive columns being disposed on the third conductive layer, and a plurality of fourth conductive columns being disposed on the fourth conductive layer;
   a first connection plate, being stacked on the second plate, and having a first connecting layer and a second connecting layer thereon, wherein at least one fifth conductive column and at least one sixth conductive column are disposed on the first connecting layer, and at least one seventh conductive column and at least one eighth conductive column being disposed on the second connecting layer;
   a third plate, being stacked on the first connection plate, and having a fifth conductive layer, a sixth conductive layer, a seventh conductive layer, and an eighth conductive layer thereon, wherein a plurality of ninth conductive columns are disposed on the fifth conductive layer, a plurality of tenth conductive columns being disposed on the sixth conductive layer, a plurality of eleventh conductive columns being disposed on the seventh conductive layer, and a plurality of twelfth conductive columns being disposed on the eighth conductive layer;
   a fourth plate, being stacked on the third plate, and being provided with an input capacitor layer, a first capacitor layer, a second capacitor layer, and an output capacitor layer thereon, wherein a plurality of thirteenth conductive columns, a plurality of fourteenth conductive columns, a plurality of fifteenth conductive columns, and a plurality of sixteenth conductive columns are disposed on the fourth plate; and
   a fifth plate, being stacked on the fourth plate, and having a second ground layer thereon, wherein a plurality of seventeenth conductive columns, a plurality of eighteenth conductive columns, a plurality of nineteenth conductive columns, and a plurality of twentieth conductive columns are disposed on the fifth plate;
   wherein the plurality of first conductive columns, the plurality of fifth conductive columns, the plurality of ninth conductive columns, the plurality of thirteenth conductive columns, and the plurality of seventeenth conductive columns are connected to each other for equivalently forming a first resonance inductor of the first resonance unit;

wherein the plurality of second conductive columns, the plurality of sixth conductive columns, the plurality of tenth conductive columns, the plurality of fourteenth conductive columns, and the plurality of eighteenth conductive columns are connected to each other for equivalently forming a second resonance inductor of the second resonance unit;

wherein the plurality of third conductive columns, the plurality of seventh conductive columns, the plurality of eleventh conductive columns, the plurality of fifteenth conductive columns, and the plurality of nineteenth conductive columns are connected to each other for equivalently forming a third resonance inductor of the third resonance unit;

wherein the plurality of fourth conductive columns, the plurality of eighth conductive columns, the plurality of twelfth conductive columns, the plurality of sixteenth conductive columns, and the plurality of twentieth conductive columns are connected to each other for equivalently forming a fourth resonance inductor of the fourth resonance unit;

wherein the first ground layer and the first conductive layer are equivalently formed as a first capacitor of the first resonance unit;

wherein the first ground layer and the second conductive layer are equivalently formed as a second capacitor of the second resonance unit;

wherein the first ground layer and the third conductive layer are equivalently formed as a third capacitor of the third resonance unit;

wherein the first ground layer and the fourth conductive layer are equivalently formed as a fourth capacitor of the fourth resonance unit;

wherein the input capacitor layer and the fifth conductive layer are equivalently formed as the first input capacitor;

wherein the input capacitor layer and the sixth conductive layer are equivalently formed as the second input capacitor;

wherein the output capacitor layer and the seventh conductive layer are equivalently formed as the first output capacitor;

wherein the output capacitor layer and the eighth conductive layer are equivalently formed as the second output capacitor;

wherein the first capacitor layer, the fifth conductive layer, and the seventh conductive layer are equivalently formed as a capacitor of the first resonance unit, and the first capacitor layer is equivalently formed as an inductor of the first resonance unit;

wherein the second capacitor layer, the sixth conductive layer, and the eighth conductive layer are equivalently formed as a capacitor of the second resonance unit, and the second capacitor layer is equivalently formed as an inductor of the second resonance unit.

4. The even-mode resonator filter of claim 3, further comprising:
a plurality of peripheral plates, being attached on the forgoing two opposite sides of the main body; and
two connection side plates, being connected between the first ground layer of the first plate and the second ground layer of the fifth plate, such that the first ground layer and the second ground layer are equivalently formed as the ground unit;
wherein the first even-mode resonance module and the second even-mode resonance module are coupled to the ground unit.

5. The even-mode resonator filter of claim 3, wherein the plurality of dielectric plates further comprise:
a second connection plate, being stacked on the fourth plate, and having a third connecting layer and a fourth connecting layer thereon, wherein at least one of a plurality of twenty-first conductive columns and at least one of a plurality of twenty-second conductive columns are disposed on the third connecting layer, and at least one of a plurality of twenty-third conductive columns and at least one of a plurality of twenty-fourth conductive columns are disposed on the fourth connecting layer;

wherein the plurality of first conductive columns, the plurality of fifth conductive columns, the plurality of ninth conductive columns, the plurality of thirteenth conductive columns, the plurality of seventeenth conductive columns, and the plurality of twenty-first conductive columns are connected to each other for equivalently forming the first resonance inductor of the first resonance unit;

wherein the plurality of second conductive columns, the plurality of sixth conductive columns, the plurality of tenth conductive columns, the plurality of fourteenth conductive columns, the plurality of eighteenth conductive columns, and the twenty-second conductive columns are connected to each other for equivalently forming the second resonance inductor of the second resonance unit;

wherein the plurality of third conductive columns, the plurality of seventh conductive columns, the plurality of eleventh conductive columns, the plurality of fifteenth conductive columns, the plurality of nineteenth conductive columns, and the twenty-third conductive columns are connected to each other for equivalently forming the third resonance inductor of the third resonance unit;

wherein the plurality of fourth conductive columns, the plurality of eighth conductive columns, the plurality of twelfth conductive columns, the plurality of sixteenth conductive columns, the plurality of twentieth conductive columns, and the twenty-fourth conductive columns are connected to each other for equivalently forming the fourth resonance inductor of the fourth resonance unit.

6. The even-mode resonator filter of claim 5, wherein each of the plurality of dielectric plates is a ceramics substrate.

7. The even-mode resonator filter of claim 1, further comprising:
at least two extra resonance modules, being coupled between the first even-mode resonance module and the second even-mode resonance module, and the at least two extra resonance modules comprising a first extra resonance unit and a second extra resonance unit; and
a plurality of filter units, being coupled between each two of the first extra resonance unit, and being coupled between each two of the second extra resonance unit, respectively;
wherein each of the plurality of the filter units has an inductor and a capacitor that is in parallel with the inductor.

* * * * *